(12) United States Patent
Takiguchi et al.

(10) Patent No.: US 12,007,698 B2
(45) Date of Patent: *Jun. 11, 2024

(54) INFORMATION PROCESSING APPARATUS AND INFORMATION PROCESSING METHOD

(71) Applicant: CANON KABUSHIKI KAISHA, Tokyo (JP)

(72) Inventors: Takahiro Takiguchi, Tochigi (JP); Kenta Kita, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/153,242

(22) Filed: Jan. 11, 2023

(65) Prior Publication Data

US 2023/0161270 A1    May 25, 2023

Related U.S. Application Data

(63) Continuation of application No. 17/239,280, filed on Apr. 23, 2021, now Pat. No. 11,579,536.

(30) Foreign Application Priority Data

Apr. 28, 2020 (JP) ................................. 2020-079056

(51) Int. Cl.
*G03F 7/00* (2006.01)
*G03F 9/00* (2006.01)
*G06F 16/901* (2019.01)

(52) U.S. Cl.
CPC ...... *G03F 7/70633* (2013.01); *G03F 7/70525* (2013.01); *G03F 7/70625* (2013.01); *G03F 9/7046* (2013.01); *G06F 16/9024* (2019.01)

(58) Field of Classification Search
CPC ............. G03F 7/70525; G03F 7/70625; G03F 7/70633; G03F 7/70491; G03F 7/70508;
(Continued)

(56) References Cited

U.S. PATENT DOCUMENTS

| 11,579,536 B2* | 2/2023 | Takiguchi ........ G05B 19/41875 |
| 2007/0162172 A1* | 7/2007 | Tanaka ............... G05B 23/0221 |
| | | 700/108 |

(Continued)

FOREIGN PATENT DOCUMENTS

| CN | 103247560 A | 8/2013 |
| JP | 2002260978 A | 9/2002 |

(Continued)

*Primary Examiner* — Peter B Kim
(74) *Attorney, Agent, or Firm* — CANON U.S.A., INC. IP Division

(57) ABSTRACT

An information processing apparatus includes an acquisition unit configured to acquire process information about a substrate process, the process information including process data and a process condition, and a display control unit configured to control a display on a display apparatus based on the process information acquired by the acquisition unit, wherein the display control unit selectively displays, on the display apparatus, a first screen that displays the process data of a lot including a plurality of substrates on a lot-by-lot basis and a second screen that displays the process data of a first lot on a substrate-by-substrate basis, the first lot being a lot designated by a user from the lot displayed on the first screen.

19 Claims, 13 Drawing Sheets

(58) Field of Classification Search
CPC . G03F 7/70533; G03F 9/7046; G05B 19/042;
G05B 19/41875; G05B 2219/2602; G05B
2219/37224; G06F 16/9024; G06F
3/1423; G06T 11/206; H01L 21/67276;
Y02P 90/02
See application file for complete search history.

(56) References Cited

U.S. PATENT DOCUMENTS

2008/0106714 A1* 5/2008 Okita .................... G03F 9/7092
355/53
2013/0060354 A1* 3/2013 Choi ................ G05B 19/41875
700/51

FOREIGN PATENT DOCUMENTS

| JP | 2018093178 A | 6/2018 |
| TW | 200604869 A | 2/2006 |

* cited by examiner

FIG.8

| LOT NAME | SETTING VALUE 1 | SETTING VALUE 2 | SETTING VALUE 3 | SETTING VALUE 4 |
|---|---|---|---|---|
| BBB | 22 | 5 | OFF | 3 |
| CCC | 21 | 6 | ON | 3 |
| EEE | 24 | 5 | ON | 3 |

~702

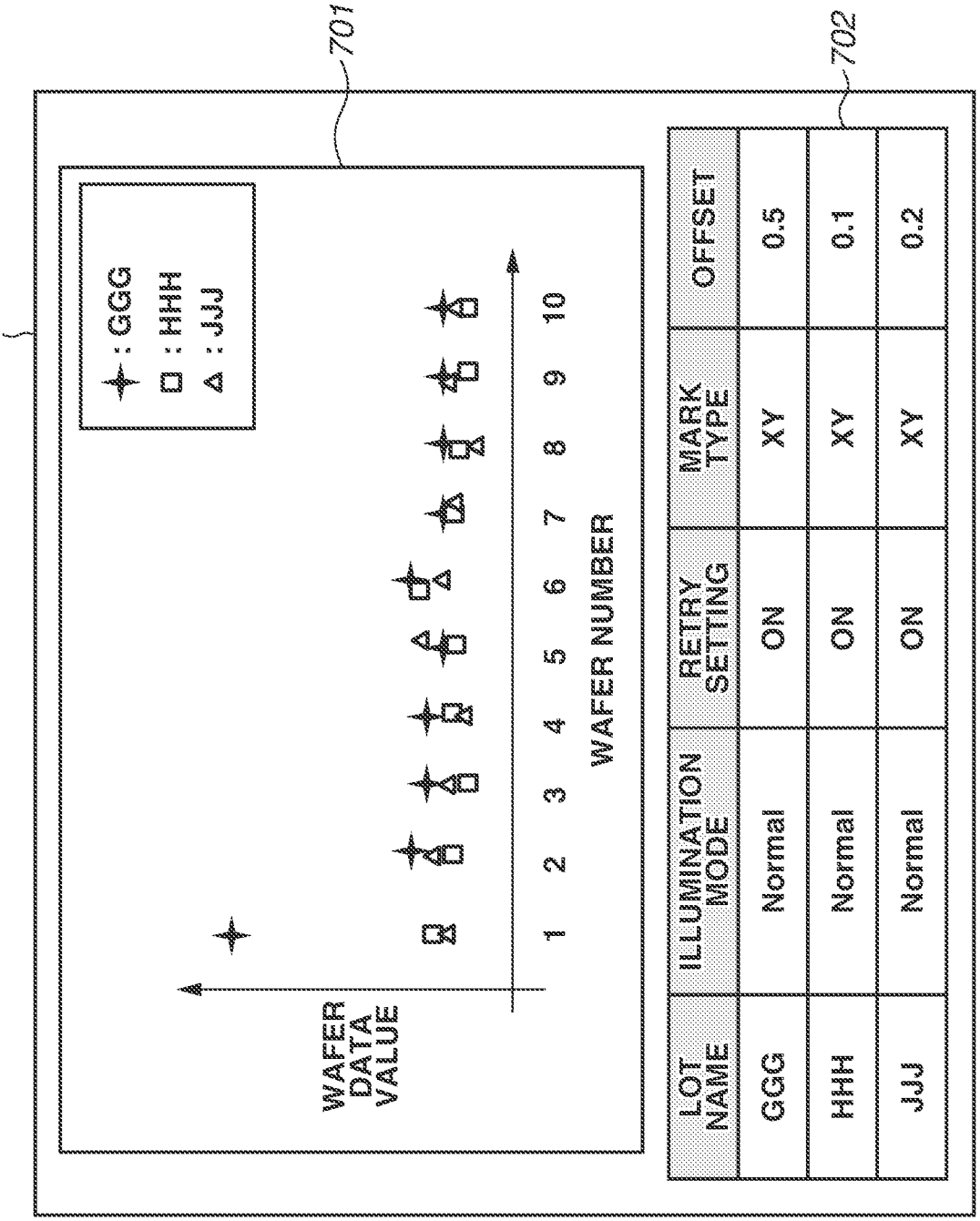

INFORMATION PROCESSING APPARATUS AND INFORMATION PROCESSING METHOD

CROSS-REFERENCE TO RELATED APPLICATIONS

This application is a continuation of U.S. application Ser. No. 17/239,280, filed Apr. 23, 2021, which claims the benefit of Japanese Patent Application No. 2020-079056, filed Apr. 28, 2020, each of which is hereby incorporated by reference herein in their entirety.

BACKGROUND OF THE INVENTION

Field of the Invention

The present invention relates to an information processing apparatus and an information processing method.

Description of the Related Art

In semiconductor manufacturing factories, semiconductor manufacturing apparatuses such as semiconductor exposure apparatuses for exposing substrates are generally installed, and the substrates are to be processed efficiently while an operation status of each apparatus is checked. Further, in a case where a failure occurs in the semiconductor manufacturing apparatuses, an operation is to be performed promptly to overcome the failure.

Japanese Patent Application Laid-Open Publication No. 2009-170612 discusses a technique for detecting a failure in a semiconductor manufacturing apparatus. Specifically, a process result of the semiconductor manufacturing apparatus is statistically processed in units of lots each including a plurality of substrates, and a result of the statistical process is displayed as a graph. This makes it easy for a user to instantly identify a lot in which a failure has occurred.

From the graph displayed based on the lots each including a plurality of substrates, the user can recognize a difference between the lots when a difference arises, but it is difficult for the user to instantly determine the cause of the difference. The user needs to determine the cause of the difference between the lots from data in units of wafers of the lots. Unless the user collects the data and analyzes the data, the user cannot determine the cause of the difference between the lots, and it takes a significant amount of time to overcome the failure.

SUMMARY OF THE INVENTION

According to an aspect of the present invention, an information processing apparatus includes an acquisition unit configured to acquire process information about a substrate process, the process information including process data and a process condition, and a display control unit configured to control a display on a display apparatus based on the process information acquired by the acquisition unit, wherein the display control unit is configured to selectively display, on the display apparatus, a first screen that displays the process data of a lot including a plurality of substrates on a lot-by-lot basis and a second screen that displays the process data of a first lot on a substrate-by-substrate basis, the first lot being a lot designated by a user from the lot displayed on the first screen.

Further features of the present invention will become apparent from the following description of embodiments with reference to the attached drawings.

BRIEF DESCRIPTION OF THE DRAWINGS

FIG. 8 is a diagram illustrating a display with process conditions of designated lots being highlighted.

FIG. 13 is a diagram illustrating a display of process data according to the third embodiment.

DESCRIPTION OF THE EMBODIMENTS

Various embodiments of the present invention will be described in detail below with reference to the attached drawings.

Figure 1:
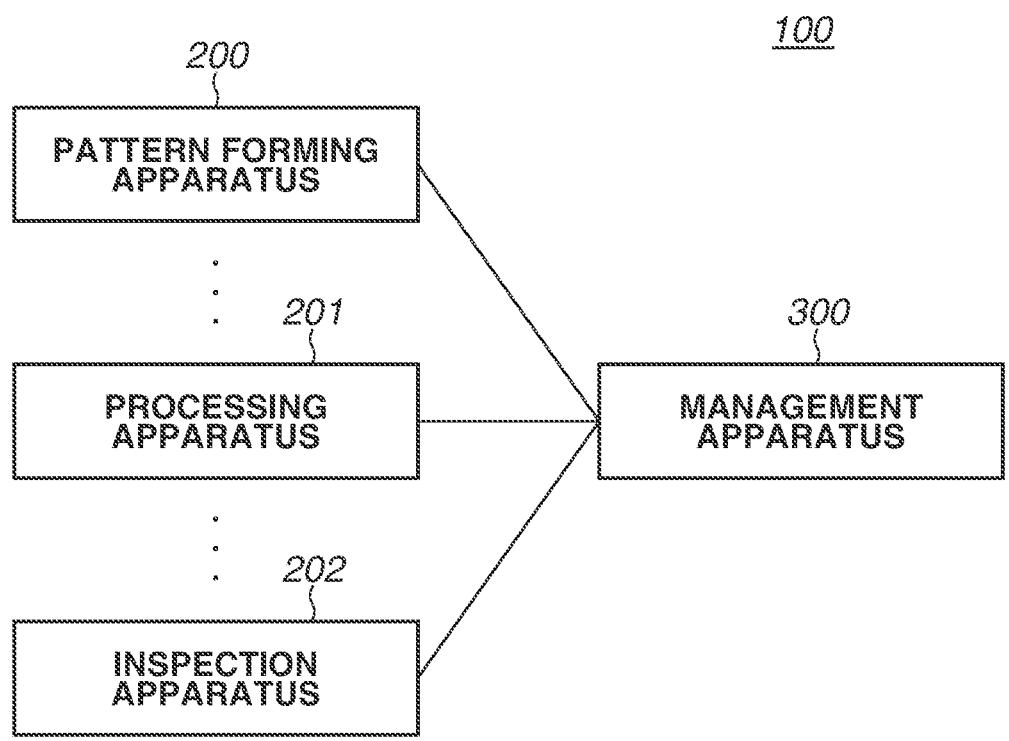
FIG. 1 is a diagram illustrating an article manufacturing system.

In a first embodiment, an article manufacturing system including a plurality of apparatuses and a management apparatus that manages the plurality of apparatuses will be described. FIG. 1 is a diagram illustrating the article manufacturing system. An article manufacturing system 100 according to the present embodiment includes a pattern forming apparatus 200, a processing apparatus 201, an inspection apparatus 202, and a management apparatus 300. The pattern forming apparatus 200 forms a pattern on a wafer (substrate). The management apparatus 300 manages the pattern forming apparatus 200, the processing apparatus 201, and the inspection apparatus 202. Further, the pattern forming apparatus 200, the processing apparatus 201, and the inspection apparatus 202 of the article manufacturing system 100 each include one or more apparatuses.

The pattern forming apparatus 200 includes an exposure apparatus that illuminates a reticle (mask, original plate) having a pattern formed thereon with light and projects the pattern onto a shot region on the wafer with the light from the reticle. Further, the pattern forming apparatus 200 includes an imprint apparatus that forms a composition having a cast shape transferred thereto by, for example, bringing an imprint material fed onto a wafer into contact with a cast (original plate, mold) and applying energy for curing to the imprint material. Further, the pattern forming apparatus 200 includes a drawing apparatus that performs drawing on a substrate with charged particle beams such as electron beams and ion beams via a charged particle optical system to form a pattern on the substrate. The pattern forming apparatus 200 performs a substrate process using the foregoing methods.

The processing apparatus 201 includes manufacturing apparatuses that perform processes other than those that are performed by apparatuses such as an exposure apparatus in manufacturing of articles such as devices. Examples of manufacturing apparatuses are an application apparatus that applies a photosensitive medium to a surface of a substrate and a development apparatus that develops the substrate having a pattern transferred thereto. The processing apparatus 201 further includes other apparatuses such as an etching apparatus and a film forming apparatus.

The inspection apparatus 202 includes, for example, an overlay inspection apparatus, a line width inspection apparatus, a pattern inspection apparatus, and an electrical characteristics inspection apparatus. The overlay inspection apparatus is an apparatus that inspects the accuracy of a displacement between patterns on upper and lower layers of a substrate including a plurality of layers each having a pattern formed thereon. Further, the line width inspection apparatus is an apparatus that inspects the accuracy of size such as a line width of a pattern formed on a substrate. Further, the pattern inspection apparatus is an apparatus that inspects the presence or absence of a pattern that does not satisfy an accuracy due to foreign particles on a substrate having a pattern formed thereon or due to lack of an imprint material. Further, the electrical characteristics inspection apparatus is an apparatus that inspects the accuracy of electrical characteristics of semiconductor devices manufactured from a substrate having a pattern formed thereon.

Figure 2:
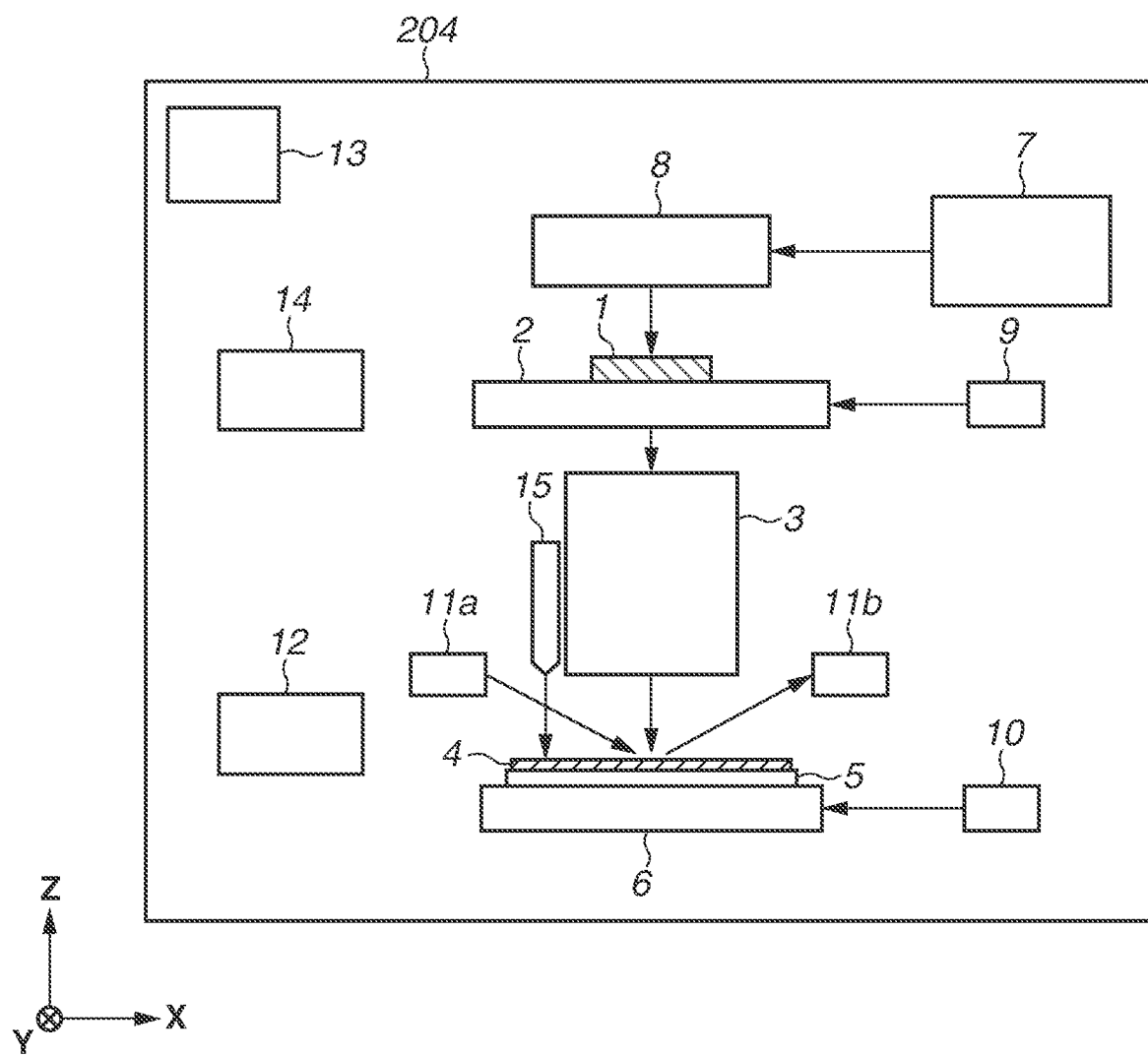
FIG. 2 is a diagram illustrating an exposure apparatus as an example of a pattern forming apparatus.

An exposure apparatus that exposes a wafer with light from a reticle having a pattern formed thereon will be described below as an example of the pattern forming apparatus 200. FIG. 2 is a diagram illustrating an exposure apparatus as an example of the pattern forming apparatus 200. An exposure apparatus of a step-and-scan method that performs exposure while synchronously driving a reticle stage and a wafer stage will be described below as an exposure apparatus 204 according to the present embodiment. Further, the exposure apparatus 204 is not limited to a scanner and can be an exposure apparatus of a step-and-repeat method that performs exposure with a wafer stage being stationary. In the example illustrated in FIG. 2, the exposure apparatus 204 includes a light source 7, an illumination optical system 8, a reticle stage 2, a projection optical system 3, a wafer stage 6, a wafer chuck 5, and a control unit 13. The exposure apparatus 204 further includes a laser interferometers 9 and 10, a focus sensor 11, a wafer conveyance unit 12, a reticle conveyance unit 14, and an alignment scope 15. Further, in FIG. 2, a direction that is parallel to an optical axis of the projection optical system 3 is a Z-axis direction, and two directions that are in a plane perpendicular to the Z-axis direction and are orthogonal to each other are respectively an X-axis direction and a Y-axis direction.

The light source 7 is, for example, a high-pressure mercury lamp, an argon fluoride (ArF) excimer laser, or a krypton fluoride (KrF) excimer laser. Further, the light source 7 does not have to be situated inside a chamber of the exposure apparatus 204 and can be an external light source. Light emitted from the light source 7 illuminates a reticle 1 via the illumination optical system 8. A pattern to be transferred onto a wafer 4 having a photosensitive material applied thereto is drawn on the reticle 1, and the reticle 1 is placed on the reticle stage 2. The reticle stage 2 holds the reticle 1 by suction via a reticle chuck and is movable by, for example, a linear motor.

The projection optical system 3 projects an image of the pattern drawn on the reticle 1 onto the wafer 4 placed on the wafer chuck 5. In projecting the image of the pattern onto the wafer 4, an image that is inverted and reduced is projected at a projection magnification (e.g., one-fourth) onto the wafer 4 via the projection optical system 3. A region onto which the image of the pattern is projected is referred to as a shot region, and a plurality of shot regions is set to the wafer 4. The projection is repeatedly performed sequentially on the shot regions.

The wafer stage 6 is driven by an actuator of the linear motor to move in X- and Y-directions. The wafer chuck 5 is placed on the wafer stage 6 and holds the wafer 4. The wafer stage 6 positions the wafer chuck 5 in Z-, θ-, ωX-, and ωY-directions. Thus, the wafer 4 held by the wafer chuck 5 is moved by the driving of the wafer stage 6 and the wafer chuck 5.

The laser interferometer 9 measures the position of the reticle stage 2 in the Y-direction and measures the orientation of the reticle stage 2. The laser interferometer 9 includes a laser interferometer that similarly measures the position of the reticle stage 2 in the X-direction. The laser interferometer 10 measures the position of the wafer stage 6 with the wafer 4 placed thereon in the Y-direction and measures the orientation of the wafer stage 6. Further, the laser interferometer 10 includes a laser interferometer that similarly measures the position of the wafer stage 6 in the X-direction. The positions of the reticle stage 2 and the wafer stage 6 are controlled by the control unit 13 described below based on the positions measured by the laser interferometers 9 and 10.

The focus sensor includes a light projecting system 11a that projects light onto the wafer 4, a light receiving system 11b that receives reflection light from the wafer 4, and a detection unit that detects light from the light receiving system 11b and outputs a detection signal to the control unit 13. The light projecting system 11a and the light receiving system 11b are situated to sandwich a neighborhood of an emission portion of the projection optical system 3. The light projecting system 11a projects oblique incident light onto the wafer 4, and the light receiving system 11b captures light reflected on the opposite side. The control unit 13 described below measures the position of the wafer 4 in the Z-direction from the detection signal detected by the focus sensor and controls the movement of the wafer 4 by the wafer stage 6.

The wafer conveyance unit 12 conveys the wafer 4. The wafer conveyance unit 12 conveys the wafer 4 from a wafer storage container for storing the wafer 4 to the wafer stage 6. Further, the wafer conveyance unit 12 conveys the wafer 4 from the wafer stage 6 to the wafer storage container.

The reticle conveyance unit 14 conveys the reticle 1. The reticle conveyance unit 14 conveys the reticle 1 from a reticle storage container for storing the reticle 1 to the reticle stage 2. Further, the reticle conveyance unit 14 conveys the reticle 1 from the reticle stage 2 to the reticle storage container.

The alignment scope 15 acquires a digital image signal of a captured image of a mark formed on the wafer 4 to position (align) the wafer 4 held on the wafer chuck 5. The alignment scope 15 includes an image sensor and an analog/digital (A/D) conversion unit. The image sensor outputs an intensity image signal based on the brightness, i.e., intensity, of the reflection light from the wafer 4. The A/D conversion unit converts the intensity image signal acquired from the image sensor into a digital image signal. The control unit 13 described below detects the position of the mark formed on the wafer 4 using the acquired digital image signal, controls the wafer stage 6 based on the detected position of the mark, and positions the wafer 4.

The control unit 13 controls an exposure process on the wafer 4 by controlling operations and adjustments of the components of the exposure apparatus 204. The control unit 13 includes, for example, a programmable logic device (PLD) such as a field programmable gate array (FPGA), an application-specific integrated circuit (ASIC), a computer with a program embedded therein, or a combination of all or some of the foregoing components. Further, the control unit 13 can be integrated with another part of the exposure apparatus 204 (the control unit 13 and the other part can be provided in the same housing) or can be provided separately from the other part of the exposure apparatus 204 (the control unit 13 and the other part can be provided in different housings). Further, the control unit 13 applies information acquired from a storage apparatus described below to control execution of the exposure process (pattern forming process) on the wafer 4.

Figure 3:
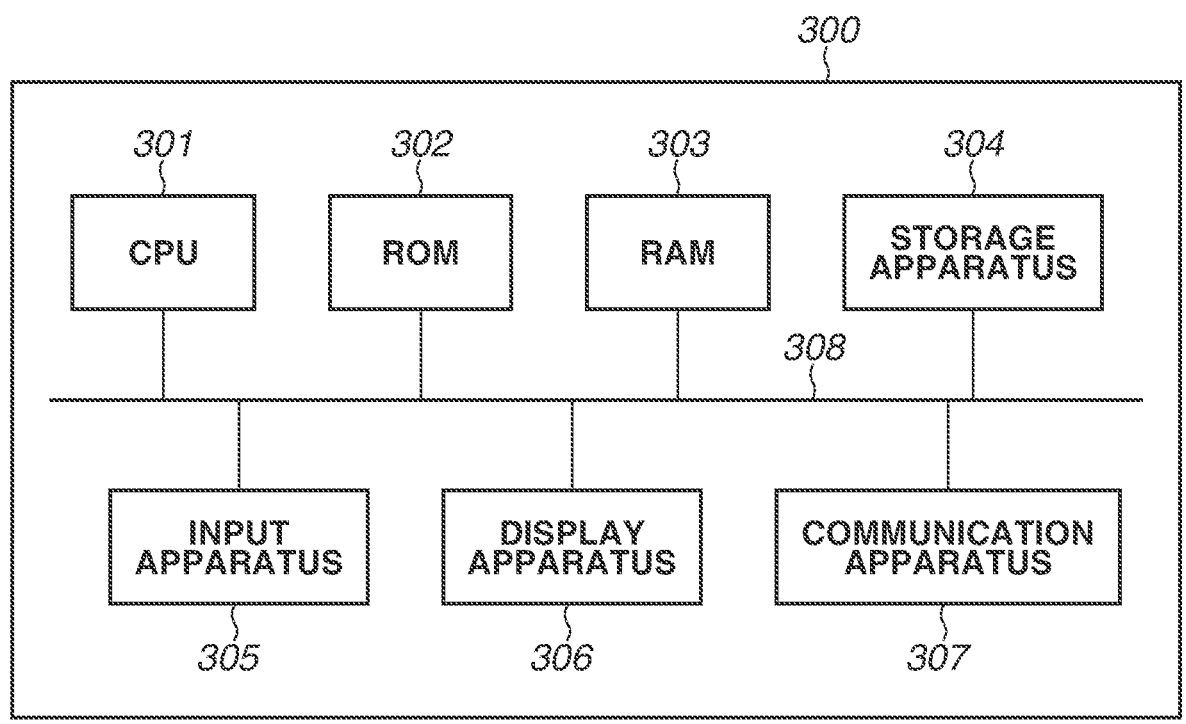
FIG. 3 is a diagram illustrating a hardware configuration of an information processing apparatus.

Next, the management apparatus 300 will be described. FIG. 3 is a diagram illustrating a hardware configuration of an information processing apparatus. The information processing apparatus includes a central processing unit (CPU) 301, a read-only memory (ROM) 302, a random access memory (RAM) 303, a storage apparatus 304, an input apparatus 305, a display apparatus 306, and a communication apparatus 307. Each piece of hardware of the information processing apparatus functions based on a program. In the example illustrated in FIG. 3, the CPU 301 is a processing apparatus that executes calculations for control based on the program and controls each component connected to a bus 308. The ROM 302 is a dedicated memory for reading data and stores programs and data. The RAM 303 is a memory for reading and writing data and is used to store programs and data. The RAM 303 is used to temporarily store data such as results of calculations by the CPU 301. The storage apparatus 304 is used to store programs and data. The storage apparatus 304 is also used as an area for temporarily storing a program of an operating system (OS) of the information processing apparatus and data.

The storage apparatus 304 is slower in data input and output than the RAM 303 but is capable of storing a large amount of data. The storage apparatus 304 is desirably a non-volatile storage apparatus that stores data as permanent data for long-term reference. The storage apparatus 304 mainly includes a magnetic storage apparatus (hard disk drive (HDD)) or a solid state drive (SSD) but can be an apparatus to which an external medium such as a compact disk (CD), a digital versatile disk (DVD), a memory card or the like is to be attached to read and write data.

The input apparatus 305 is an apparatus for inputting characters and data to the information processing apparatus. The input apparatus 305 is various keyboards and mouses. The display apparatus 306 is an apparatus that plays the role as a user interface of the management apparatus 300 and displays necessary information for operations of the information processing apparatus and process results. The display apparatus 306 is a cathode ray tube (CRT) or a liquid crystal monitor. The display apparatus 306 that is operable by touching a screen, such as a touch panel, also plays the role of the input apparatus 305. While the input apparatus 305 and the display apparatus 306 are described as a part of the management apparatus 300, the input apparatus 305 and the display apparatus 306 are not limited to those described and can be, for example, a part of the pattern forming apparatus 200.

The communication apparatus 307 is used to communicate with another apparatus by connecting to a network and performing data communication based on communication protocols such as Transmission Control Protocol over Internet Protocol (TCP/IP). Further, the information processing apparatus can include a graphical processing unit (GPU) to enable high-speed calculation processing. The management apparatus 300 is an information processing apparatus and connects to the plurality of exposure apparatuses 204 via the communication apparatus 307 to communicate data with the plurality of exposure apparatuses 204.

Figure 4:
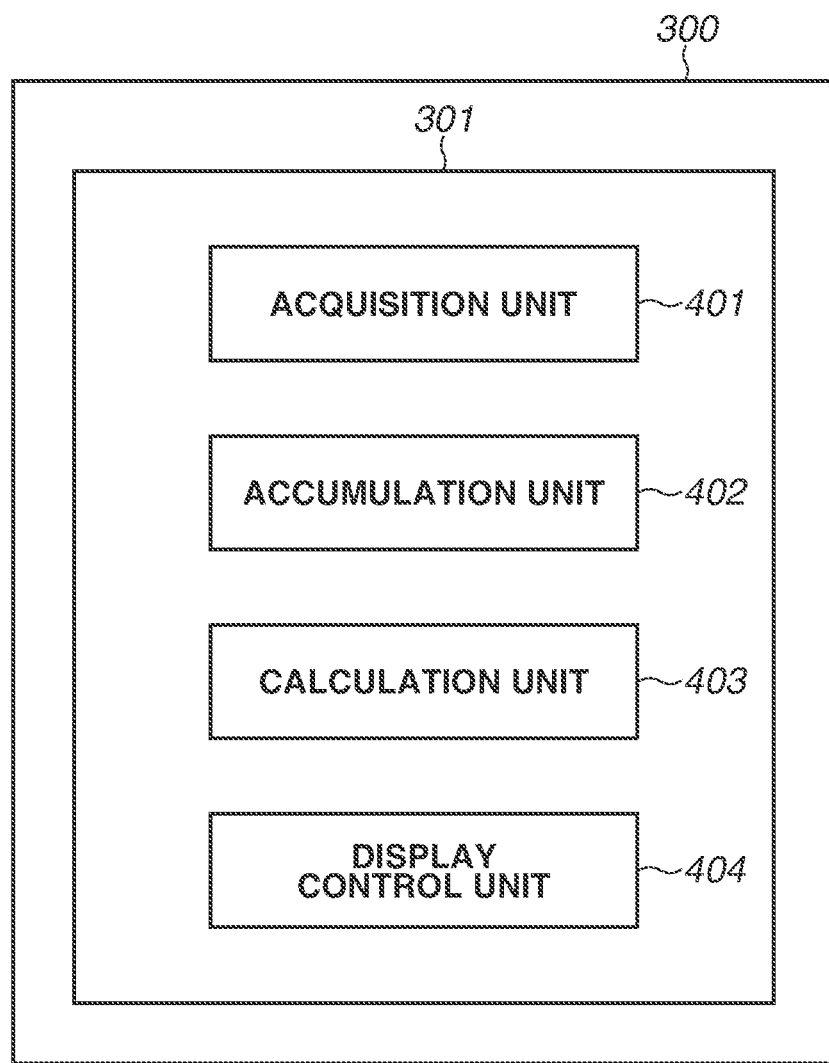
FIG. 4 is a diagram illustrating a configuration of a central processing unit (CPU) of a management apparatus.
Figure 5:
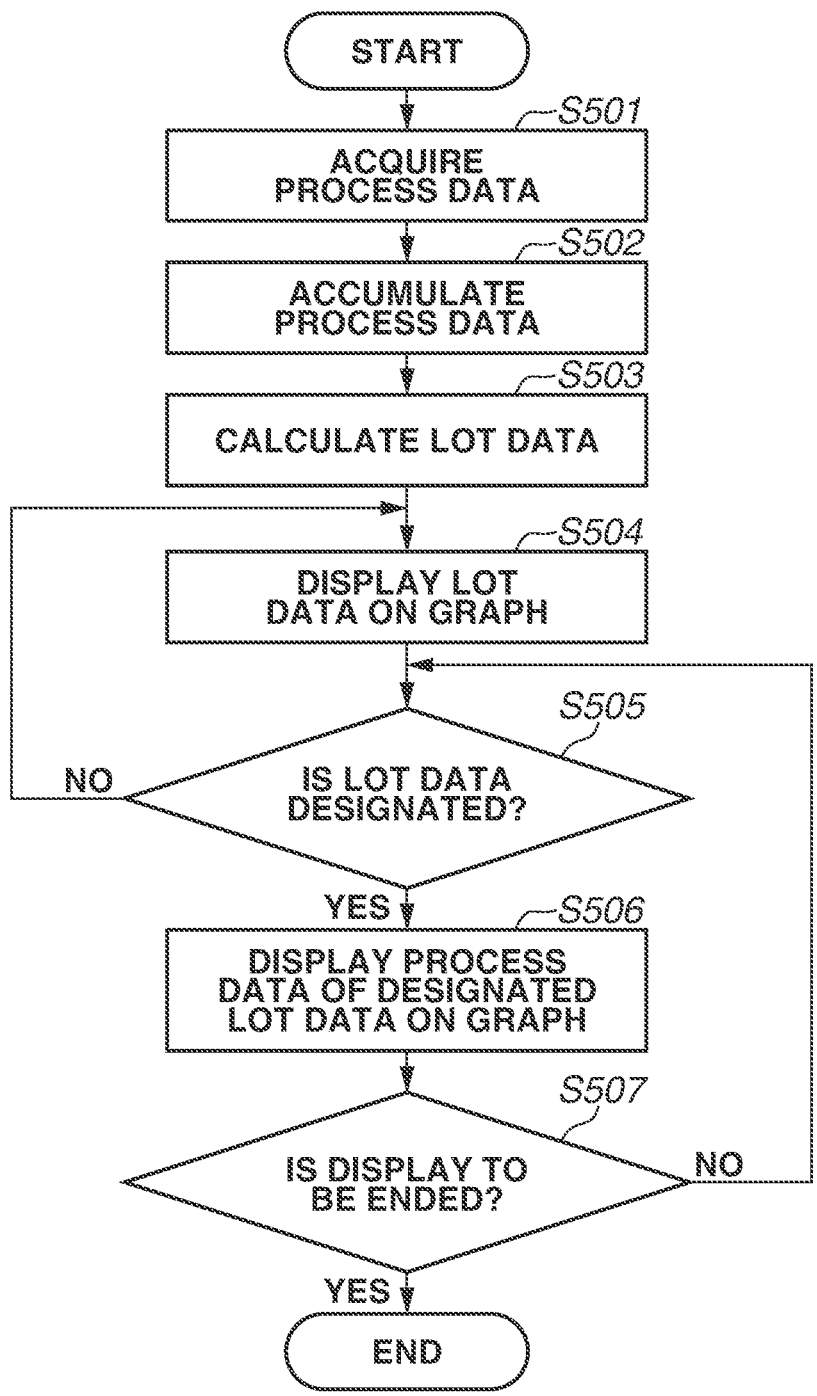
FIG. 5 is a flowchart illustrating a display process of a display apparatus.

FIG. 4 is a diagram illustrating a configuration of the CPU 301 of the management apparatus 300. The CPU 301 includes an acquisition unit 401, an accumulation unit 402, a calculation unit 403, and a display control unit 404. FIG. 5 is a flowchart illustrating a display process of the display apparatus 306 for analyzing a failure that has occurred in the exposure apparatus 204.

The display process of the display apparatus 306 of the management apparatus 300 according to the present embodiment will be described with reference to FIGS. 4 and 5. In the present embodiment, the display of the display apparatus 306 reduces the time needed to analyze a cause of a failure in the exposure apparatus 204. The term "failure" in the present embodiment refers to a failure that is significant enough to stop the exposure apparatus 204 and also refers to a failure that decreases the accuracy of the exposure apparatus 204 to affect productivity.

The flowchart illustrated in FIG. 5 will be described. In step S501, the acquisition unit 401 acquires process information about the exposure apparatus 204. The process information about exposure apparatus 204 includes process data of the exposure apparatus 204 and a process condition applied in the exposure process. The process data of the exposure apparatus 204 is information including an operation result of the exposure apparatus 204 and a state of the wafer 4 exposed by the exposure apparatus 204. The content of the process data is specifically synchronization accuracy data and alignment accuracy data. The synchronization accuracy data is data that represents an error in relative positions of the reticle stage 2 and the wafer stage 6 during a period of, for example, synchronously driving the reticle stage 2 and the wafer stage 6 in the Y-axis direction to expose a target shot region. Further, the alignment accuracy data is data that represents waveform data of the digital image signal acquired by capturing the image of the mark formed on the target wafer 4 and an evaluation (the symmetry of the waveform data, the contrast of the digital image signal) of the digital image signal.

The process condition applied in the exposure process refers to a recipe determined for each recipe of a wafer to be manufactured and an apparatus parameter determined for each exposure apparatus 204. The recipe is the process condition that is shared and used by the plurality of exposure apparatuses 204. The apparatus parameter is the process condition that is not shared by the plurality of exposure apparatuses 204. The recipe is, for example, the amount of exposure in wafer exposure and the selection of an individual correction value and a correction algorithm to follow an exposed pattern. The apparatus parameter is, for example, a correction value of the projection optical system 3, a method of controlling the wafer stage 6, and a control parameter. Further, the process conditions to be displayed in a table 702 are not limited to those described above, and parameters that define other process conditions can be displayed.

Next, in step S502, the process data and the process condition of the exposure apparatus 204 acquired in step S501 are accumulated in the accumulation unit 402. As to the process data, for example, wafer-based process data (on a substrate-by-substrate basis) is accumulated in the accumulation unit 402.

In step S503, the calculation unit 403 calculates lot data that is lot-based process data based on the wafer-based process data accumulated in the accumulation unit 402. The lot data is calculated based on statistical values (e.g., maximum value, minimum value, mean value, median value, standard deviation) of the wafer-based process data. Further, the lot data can be calculated by the exposure apparatus 204 instead of the calculation unit 403. For example, the acquisition unit 401 can acquire the lot data calculated by the exposure apparatus 204 from the exposure apparatus 204, and the processing proceeds to step S504.

Figure 6:
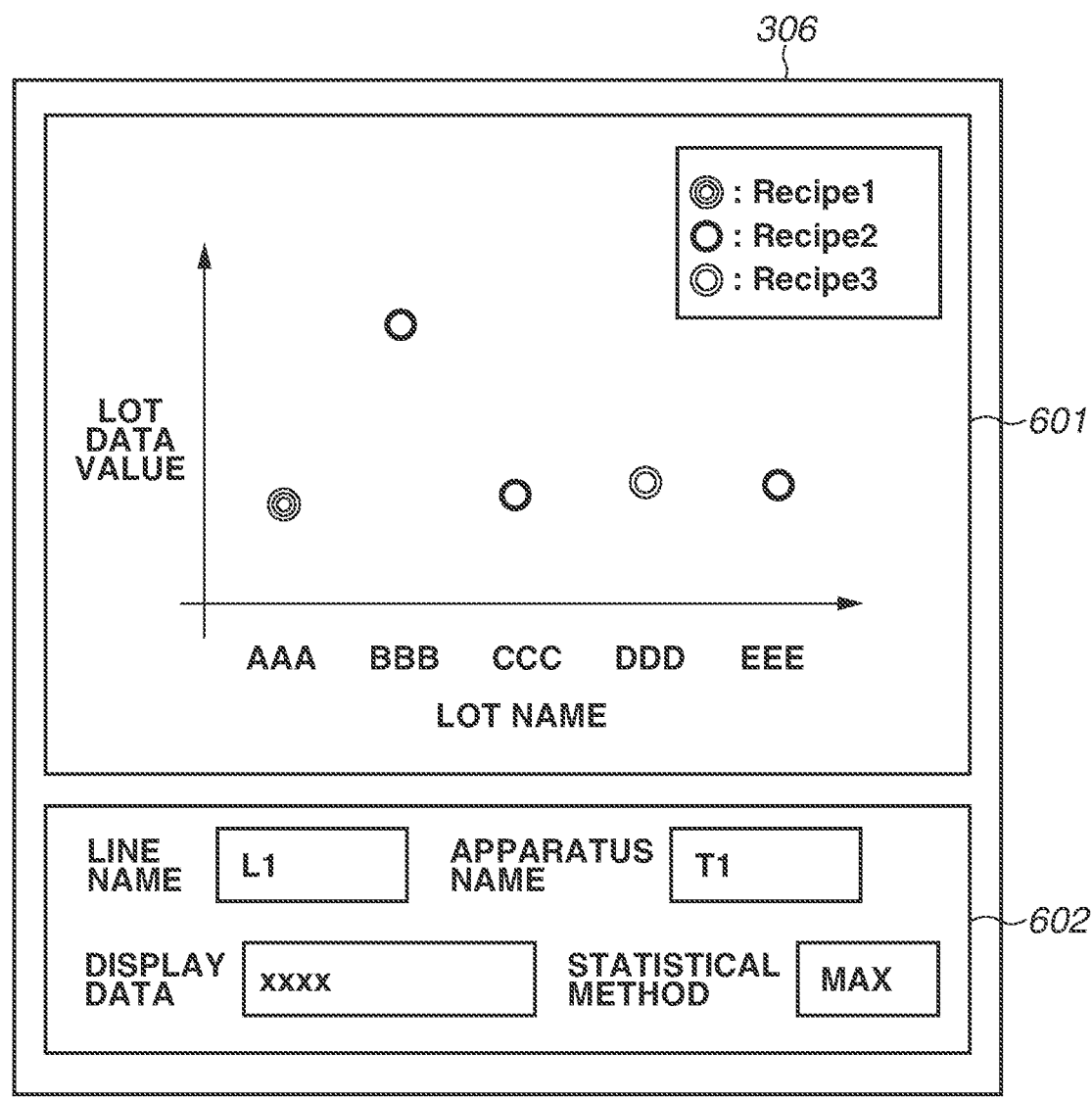
FIG. 6 is a diagram illustrating a display of lot data according to a first embodiment.

In step S504, the display control unit 404 outputs the lot data to the display apparatus 306 and controls the display apparatus 306 to display the lot data as illustrated in FIG. 6. FIG. 6 illustrates a screen that displays the lot data. The horizontal axis of a graph 601 represents the names of lots executed by the exposure apparatus 204, and the vertical axis represents lot data values that are the values of the lot-based process data.

In a setting field 602, content to be displayed in the graph 601 can be input or selected. A user inputs or selects the name of a semiconductor manufacturing line where the exposure apparatus 204 is situated, information that identifies the apparatus (e.g., ID that identifies the apparatus), data to be displayed, and a statistical method for calculating a statistical value (e.g., maximum value, minimum value, mean value, median value, standard deviation). The display apparatus 306 updates the displayed content of the graph 601 based on the input or selected content. In the graph 601, a color and/or a shape in the display can be changed for each recipe in the execution of the lots.

In step S505, the display control unit 404 determines whether a lot is designated by the user. In a case where a lot is designated (YES in step S505), the processing proceeds to step S506. The user designates a lot by selecting lot data plotted on the graph 601 or by inputting a lot name. A lot designation method is realized by an input device for a computer, such as a mouse, a keyboard, or a touch panel, and a program that controls the input device. The user designates a lot in which a failure has occurred to identify a cause of the failure by a method described below.

Figure 7:
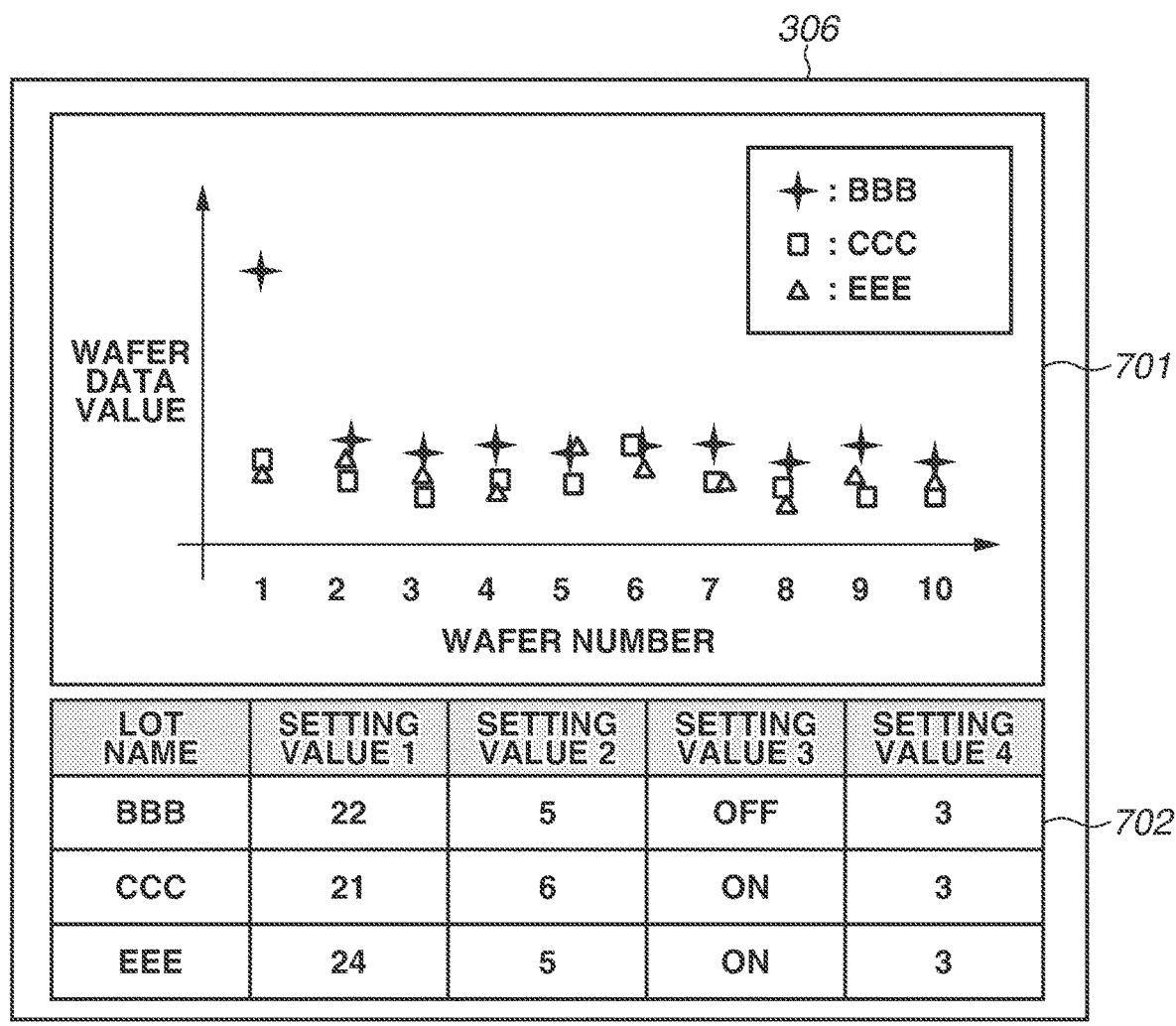
FIG. 7 is a diagram illustrating a display of process data according to the first embodiment.

In step S506, the display control unit 404 outputs the process data of the lot designated in step S505 to the display apparatus 306, and the display apparatus 306 displays FIG. 7. FIG. 7 illustrates a screen that displays a graph 701 of the process data and the table 702 illustrating the process conditions of the exposure process. The horizontal axis of the graph 701 represents wafer numbers, and the vertical axis of the graph 701 represents wafer data values that are the values of the wafer-based process data.

The table 702 displays the names of the lots and the process conditions of the exposure apparatus 204. All the process conditions can be displayed, or only the process conditions that relate to the process data may be displayed. The relationship between the process data and the process conditions that relate to the process data can be stored in the storage apparatus 304, and the user can statically or dynamically designate the relationship between the process data and the process conditions that relate to the process data.

In the graph 701, the process data of each lot having undergone the exposure process by the same recipe as that of the user-designated lot is also displayed as a display comparison target with respect to the lot designated in step S506. The table 702 displays the designated lot and the process conditions of the lots for comparison. While each lot that has undergone the exposure process by the same recipe as that of the user-designated lot will be described as a comparison target lot, the comparison target lot is not limited to that described above and can be a lot that has undergone the exposure process using one or more process conditions that are the same as those of the user-designated lot.

The user checks the content displayed on the display apparatus 306 in step S506 and analyzes differences in wafer-based process data, trends, and process conditions between the designated lot and the other lots. The user identifies a cause of the failure in the exposure apparatus 204 based on the analysis results and performs an operation to overcome the failure.

In step S507, in a case where the user determines to end the screen, the display on the display apparatus 306 is ended.

The above-described process up to the overcoming of the failure in the exposure apparatus 204 will be described in more detail below by associating the screen displayed on the display apparatus 306 with user operations. The user first displays the screen illustrated in FIG. 6 to check whether a failure is present in the exposure apparatus 204. By checking the graph 601, the user recognizes that the lot data of a lot BBB is significantly greater than the other lot data. Then, in order to analyze a cause of the difference, the user designates the lot BBB of the graph 601 on the screen. The screen display of the display apparatus 306 is switched from the graph 601 to the graph 701 and the table 702 in FIG. 7. At this time, wafer-based process data and process conditions of lots CCC and EEE having undergone the exposure process by the same recipe as that of the lot BBB are also displayed.

The wafer-based process data displayed in the graph 701 is the process data from which the lot data displayed in the graph 601 is calculated. By checking the graph 701, the user can recognize that the values of the process data of the first wafer among the ten wafers of the lot BBB are greater than those of the second to tenth wafers and the wafers of the other lots. It is also recognized that setting values 1 to 3 among the setting values 1 to 4 of the process conditions displayed in the table 702 are different from those of the other lots. Further, the setting values 1 and 2 are substantially the same numerical values and are thus considered to have little effect, so that it is determined that the difference in the setting value 3 is the cause of the failure.

Figure 9:
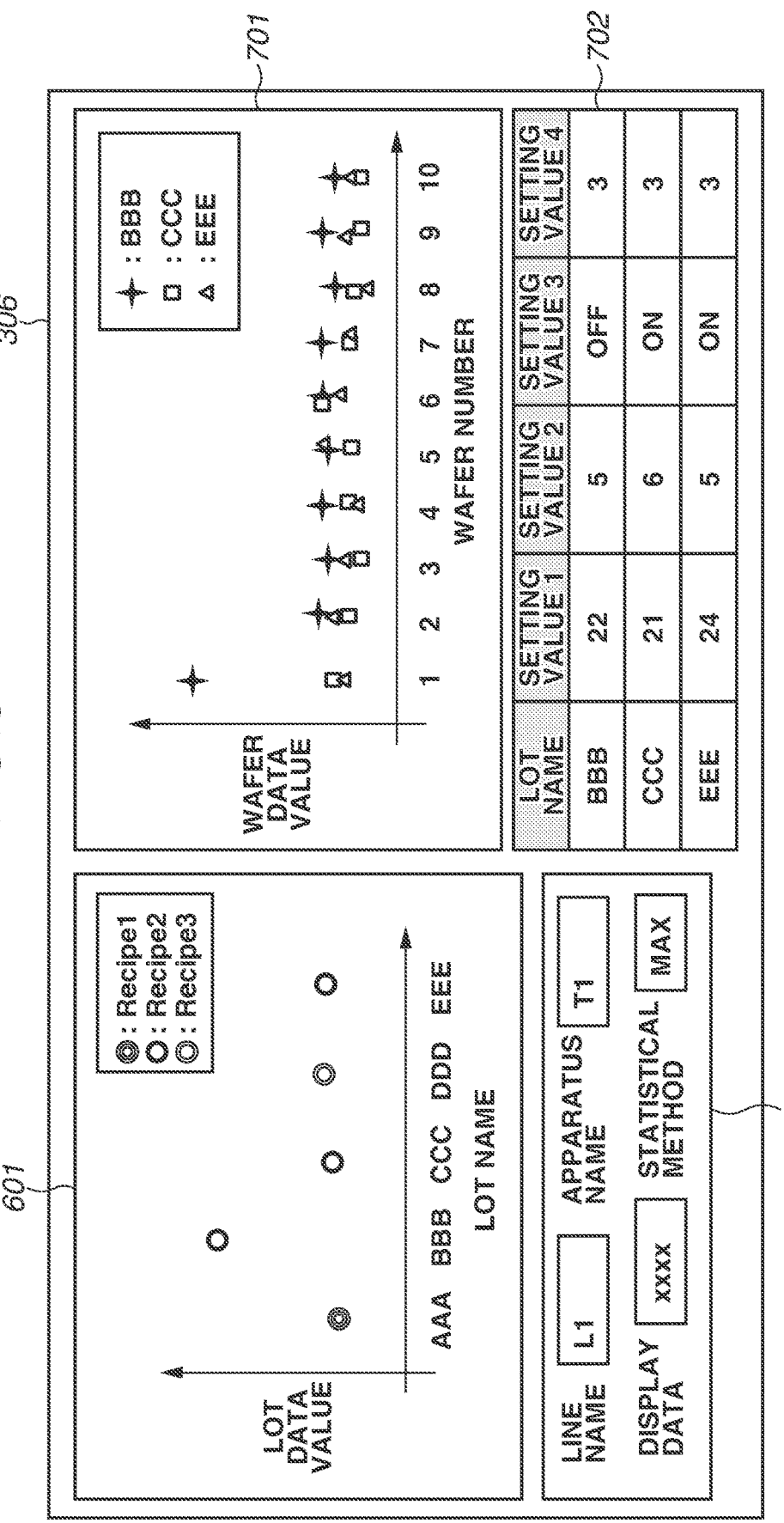
FIG. 9 is a diagram illustrating lot data and process data displayed on the same screen.

As a result, the user determines that the difference between the lots results from the setting value 3 and promptly performs an operation such as changing the processing condition to the same process condition as those of the other lots. In order to make the analysis operations more efficient, each process condition that differs between the lots can be highlighted. FIG. 8 illustrates an example of the process conditions that are highlighted. In a case where the user designates the lots BBB and EEE, only the setting values 1 and 3, which are different process conditions among the displayed process conditions, are highlighted. This makes it easy for the user to visually determine the differences in the process conditions between the lots. While the display in the table is highlighted by changing characters to outline characters in the example illustrated in FIG. 8, for example, the color, thickness, and font of the characters can be changed from those of the other content, or the color and thickness of frames can be changed, or each portion of different content can be blinked. Further, as described above, the displays in FIGS. 6 and 7 can selectively be displayed on the display apparatus 306, or the graph 601, the setting field 602, the graph 701, and the table 702 can be displayed on the same screen as illustrated in FIG. 9.

While the example in which a cause of a failure in the pattern forming apparatus 200 such as the exposure apparatus 204 is analyzed is described in the present embodiment, the information processing apparatus according to the present embodiment is applicable to the analysis of a cause of a failure in a semiconductor manufacturing apparatus other than the pattern forming apparatus 200. For example, the information processing apparatus according to the present embodiment is applicable to the analysis of a cause of a failure in the processing apparatus 201 and the inspection apparatus 202.

As described above, in the present embodiment, the wafer-based process data of the designated lot is displayed as a graph on the display apparatus 306. This makes it easy to analyze in which wafer a failure has occurred. Furthermore, since the process conditions are also displayed, a process condition that can be a cause of a failure can be instantly analyzed. This reduces the time needed to overcome the failure.

In a second embodiment, a more specific situation than that in the first embodiment will be described. In the present embodiment, a method of analyzing a failure that relates to the stage synchronization accuracy of the exposure apparatus 204 will be described. The stage synchronization accuracy is data that represents an error in relative positions of the reticle stage 2 and the wafer stage 6 in a period of synchronously driving the reticle stage 2 and the wafer stage 6, for example, in the Y-axis direction to expose the target shot region. Those that are not described in the present embodiment are as described in the first embodiment.

Figure 10:
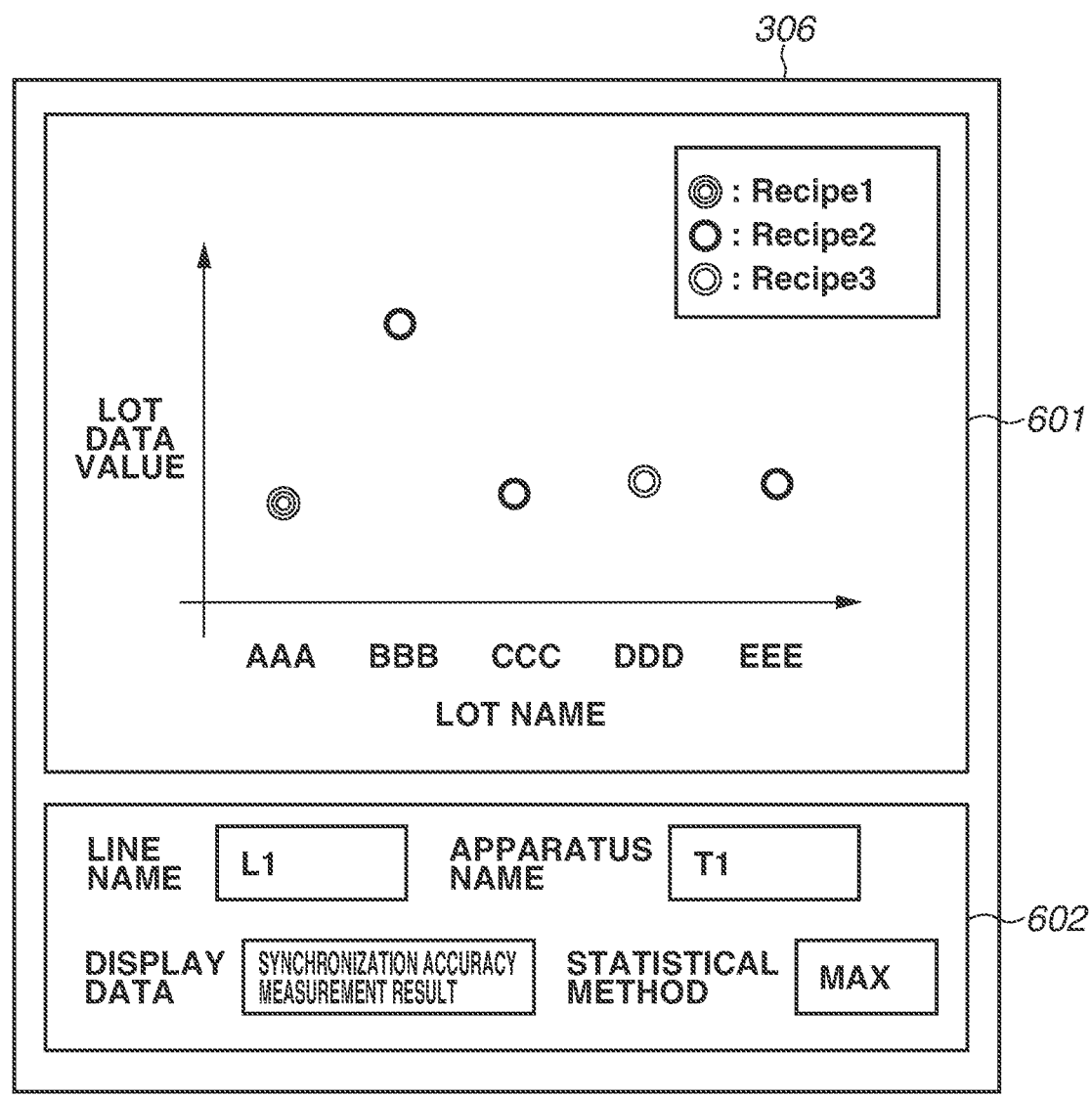
FIG. 10 is a diagram illustrating a display of lot data according to a second embodiment.

The user enters a line name (e.g., ID that identifies a factory, a building, or a manufacturing line) and an apparatus name (e.g., ID that identifies the apparatus) in the setting field 602 on a screen illustrated in FIG. 10 corresponding to step S504 in FIG. 5 in the first embodiment. In FIG. 10, "L1" and "T1" are respectively entered as the line name and the apparatus name. Further, the user enters the display data in the setting field 602. In FIG. 10, "synchronization accuracy measurement result" is entered as the display data. The user further enters the statistical method in the setting field 602. The statistical method is a statistical method (e.g., maximum value, minimum value, mean value, median value, standard deviation) employed for the calculation of lot data by the calculation unit 403. In FIG. 10, in order to compare the wafers 4 of the lowest accuracies of the synchronization accuracy measurement results among the wafers 4 of the lot, the setting "MAX" for calculating the maximum value is entered as the statistical method. The display apparatus 306 displays the graph 601 based on the settings entered in the setting field 602.

By checking the graph 601, the user can recognize that the statistical value of the lot BBB is greater than that of the other lots. The user can also recognize that the values of the lots CCC and EEE having undergone the exposure process by the same recipe as that of the lot BBB are smaller than that of the lot BBB. In order to analyze the difference in more detail, the user designates the lot BBB.

Figure 11:
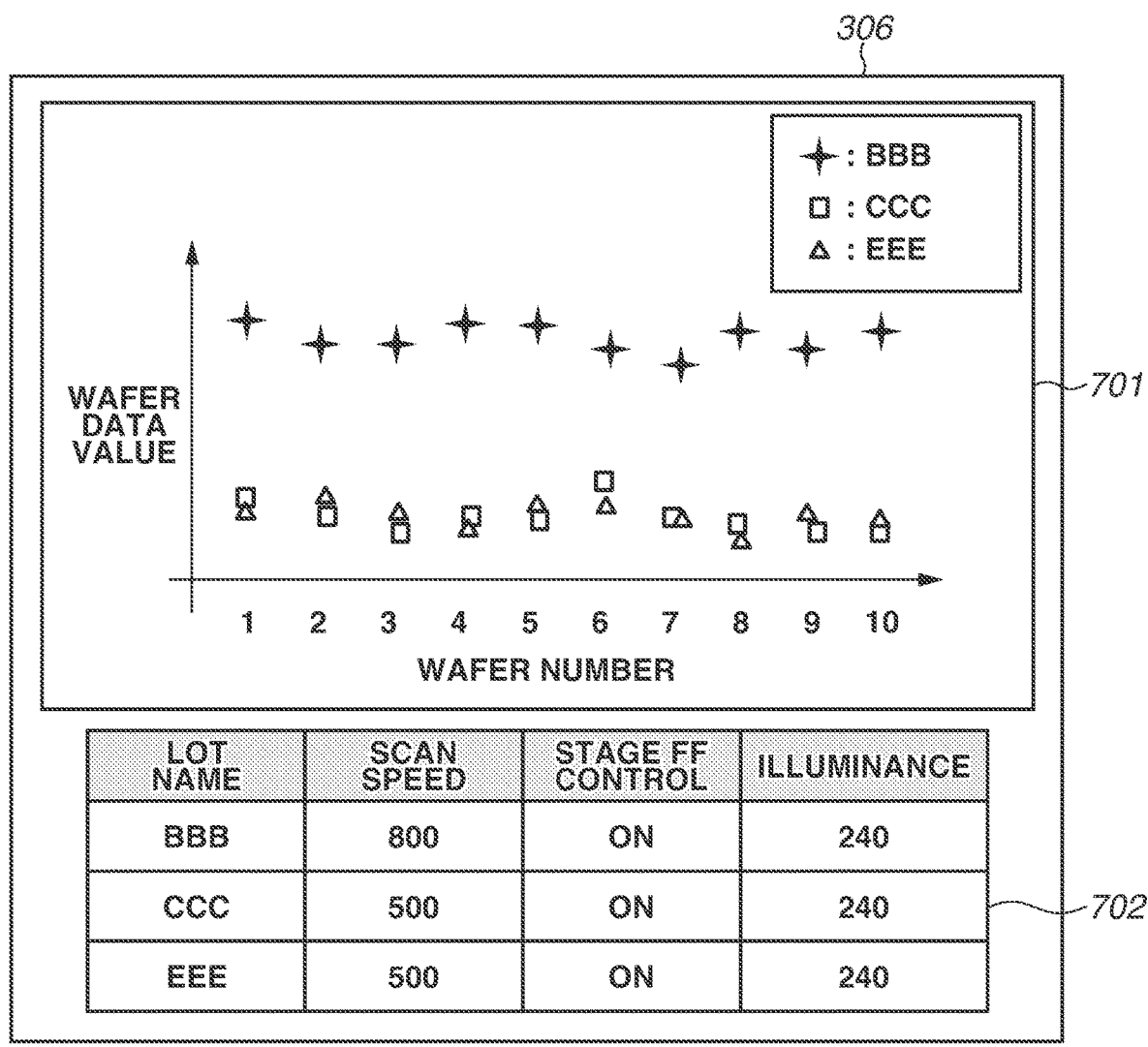
FIG. 11 is a diagram illustrating a display of process data according to the second embodiment.

The display apparatus 306 displays a graph of the synchronization accuracy measurement results of the wafers 4 having undergone the exposure process in the lot BBB, the process conditions of the lot BBB, and the synchronization accuracy measurement results and the process conditions of the lots CCC and EEE having undergone the exposure process by the same recipe as that of the lot BBB as illustrated in FIG. 11. At this time, only the process conditions that relate to the synchronization accuracy may be displayed in the table 702. The process conditions that relate to the stage synchronization accuracy are, for example, the scan speed of the wafer stage 6, a setting for controlling the linear motor that drives the wafer stage 6 using a feedforward (FF) technique, and an illuminance of the light source 7 during exposure. By checking the graph 701, the user can recognize that the synchronization accuracy measurement results of all the wafers 4 having undergone the exposure process in the lot BBB are greater than those of the other lots. By checking the table 702 and comparing the process conditions of the lots, the user can determine that the scan speed of the lot BBB is higher than those of the other lots.

Thus, the user can analyze that the difference in the synchronization accuracy measurement results is due to the difference in the scan speed and can instantly perform an operation to overcome the failure in the exposure apparatus 204.

In a third embodiment, a case where a failure that is different from that in the second embodiment occurs will be described. In the present embodiment, a method of analyzing a failure that relates to an alignment measurement result of the exposure apparatus 204 will be described. The alignment measurement result is the waveform data of the digital image signal acquired by capturing the image of the mark formed on the target wafer 4 and the data of the evaluation (the symmetry of the waveform data, the contrast of the digital image signal) of the digital image signal. Those that are not described in the present embodiment are as described in the first embodiment.

Figure 12:
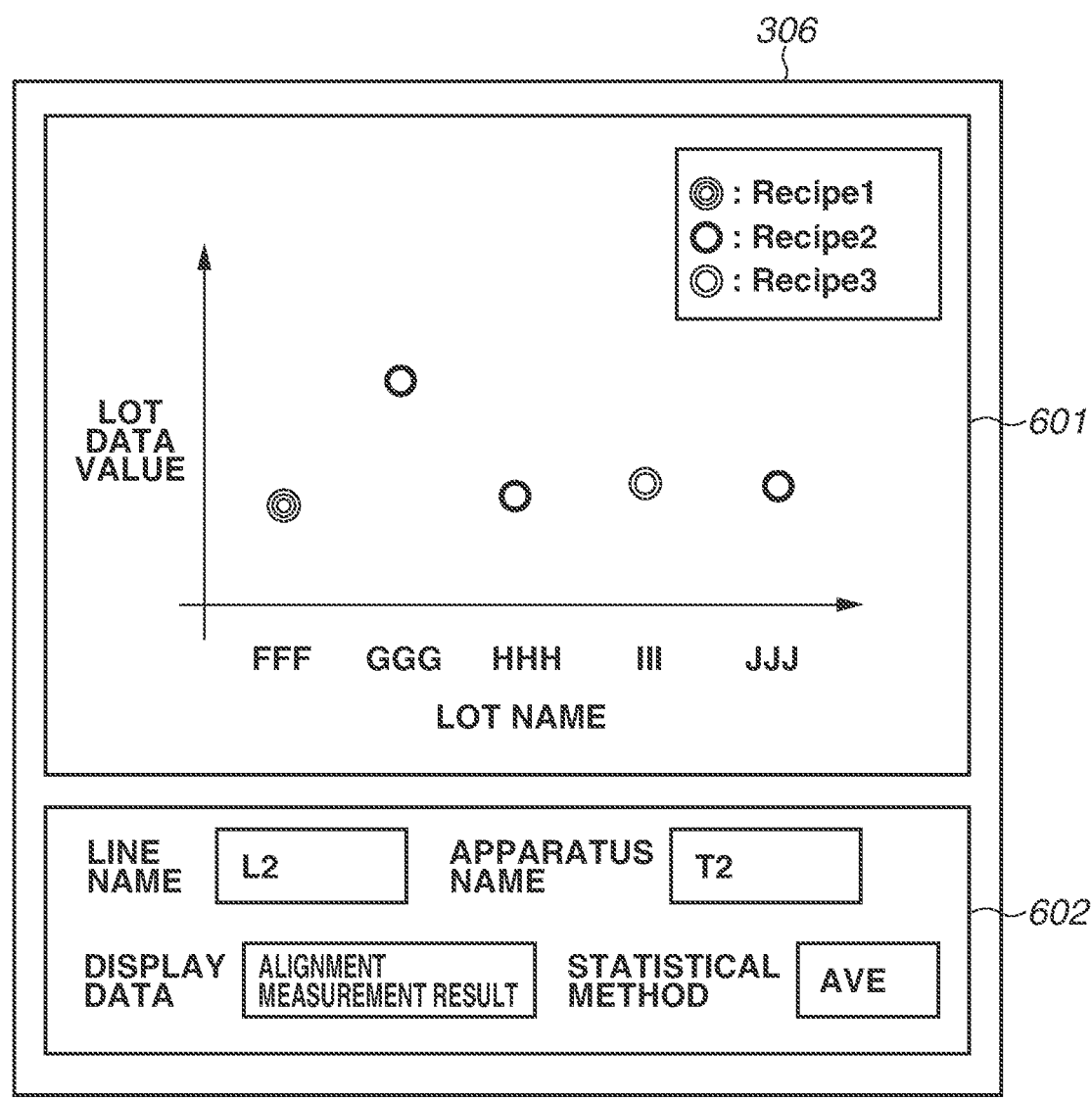
FIG. 12 is a diagram illustrating a display of lot data according to a third embodiment.

The user enters a line name (e.g., ID that identifies a factory, a building, or a manufacturing line) and an apparatus name (e.g., ID that identifies the apparatus) in the setting field 602 on a screen illustrated in FIG. 12 corresponding to step S504 in FIG. 5 in the first embodiment. In FIG. 12, "L2" and "T2" are respectively entered as the line name and the apparatus name. Further, the user enters the display data in the setting field 602. In FIG. 12, "alignment measurement result" is entered as the display data. The user further enters the statistical method in the setting field 602. The statistical method is a statistical method (e.g., maximum value, minimum value, mean value, median value, standard deviation) for the calculation of lot data by the calculation unit 403. In FIG. 12, in order to compare the mean values of the wafers 4 of the lot, the setting "AVE" for calculating the mean value is entered as the statistical method. The display apparatus 306 displays the graph 601 based on the settings entered in the setting field 602.

By checking the graph 601, the user can recognize that the lot data of a lot GGG is greater than the other lot data. The user can further recognize that the lot data of lots HHH and JJJ having undergone the exposure process by the same recipe as that of the lot GGG is smaller than the lot data of the lot GGG. In order to analyze the differences in detail, the user designates the lot GGG.

The display apparatus 306 displays a graph of the alignment measurement results of the exposure process on the lot GGG, the process conditions of the lot GGG, the alignment measurement results and the process conditions of the lots HHH and JJJ having undergone the exposure process by the same recipe as that of the lot GGG, as illustrated in FIG. 13. At this time, only the process conditions that relate to the alignment measurement may be displayed in the table 702. The process conditions that relate to the alignment measurement are, for example, an illumination mode, a setting of selecting whether to execute a retry in a case where a failure occurs, the type of the mark formed on the wafer 4, and an offset value in the alignment measurement. By checking the graph 701, the user can recognize that the alignment measurement result of the wafer 4 that is exposed first among the wafers 4 of the lot GGG is significantly different whereas the alignment measurement results of the other wafers 4 are not significantly different from those of the wafers 4 of the other lots. By checking the table 702 and comparing the process conditions of the lots, the user can recognize that the offset value of the lot GGG is greater than those of the other lots.

Thus, the user can analyze that the difference in the alignment measurement results is due to the difference in the offset values and can instantly perform an operation to overcome the failure in the exposure apparatus 204.

<Embodiments of Article Manufacturing Methods>

An article manufacturing method according to an embodiment of the present invention is suitable for manufacturing articles such as micro devices, i.e., semiconductor devices, and elements having a fine structure. The article manufacturing method according to the present embodiment can include forming a pattern of an original plate on a substrate using the article manufacturing system and processing the substrate having the formed pattern thereon. The article manufacturing method can further include other well-known processes (oxidation, film forming, vapor deposition, doping, flattening, etching, resist removing, dicing, bonding, packaging). The article manufacturing method according to the present embodiment is more advantageous than conventional methods in at least one of the performance, quality, productivity, and production costs of articles.

The present invention is directed to a technique that is advantageous in reducing the time of analyzing a cause of a failure in a semiconductor manufacturing apparatus.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a solid state disk (SSD), a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to embodiments, it is to be understood that the invention is not limited to the disclosed embodiments, but is defined by the scope of the following claims.

What is claimed is:

1. An information processing apparatus comprising:
an acquisition unit configured to acquire process information about a substrate process, the process information including process data and a recipe; and
a display control unit configured to control a display on a display apparatus based on the process information acquired by the acquisition unit,
wherein the display control unit is configured to selectively display, on the display apparatus, a first screen or a second screen,
wherein the first screen displays the process data of a plurality of lots, on a lot-by-lot basis, and
wherein the second screen simultaneously displays a first process data of a first lot and a second process data of a second lot, on a substrate-by-substrate basis, the first lot being a lot designated from the plurality of lots displayed on the first screen,
the second lot being processed by the same recipe as a recipe by which the first lot is processed, and
wherein the second screen displays the first process data of each of a plurality of substrates included in the first lot and the second process data of each of a plurality of substrates included in the second lot.

2. The information processing apparatus according to claim 1, wherein the process data is information including a result of an operation of a processing apparatus that performs the substrate process and a state of the substrate having undergone the substrate process.

3. The information processing apparatus according to claim 1, wherein the display control unit is configured to display, on the display apparatus, the second screen that displays the process data of the plurality of lots on a substrate-by-substrate basis and the recipe of the plurality of lots.

4. The information processing apparatus according to claim 1, wherein at least one of the first screen and the second screen displays the process data as a graph.

5. The information processing apparatus according to claim 1, wherein a display method by which the second screen is displayed on the display apparatus is changeable to highlight a process condition that has a difference among process conditions of the plurality of lots.

6. The information processing apparatus according to claim 1, further comprising a calculation unit configured to calculate lot-based process data based on a plurality of pieces of substrate-based process data acquired by the acquisition unit.

7. The information processing apparatus according to claim 6, wherein the calculation unit is configured to calculate the lot-based process data based on at least one statistical process from a maximum value, a minimum value, a mean value, a median value, and a standard deviation of the plurality of pieces of substrate-based process data.

8. An information processing apparatus comprising:
an acquisition unit configured to acquire process information about a substrate process, the process information including process data and a recipe; and
a display control unit configured to control a display on a display apparatus based on the process information acquired by the acquisition unit,
wherein the display control unit is configured to display, on the display apparatus, a first screen that displays the process data of a plurality of lots, on a lot-by-lot basis, together with a second screen that simultaneously displays a first process data of a first lot and a second process data of a second lot, on a substrate-by-substrate basis, the first lot being a lot designated from the plurality of lots displayed on the first screen,
the second lot being processed by the same recipe as a recipe by which the first lot is processed, and
wherein the second screen displays the first process data of each of a plurality of substrates included in the first lot and the second process data of each of a plurality of substrates included in the second lot.

9. The information processing apparatus according to claim 8, wherein the process data is information including a result of an operation of a processing apparatus that performs the substrate process and a state of the substrate having undergone the substrate process.

10. The information processing apparatus according to claim 8, wherein the display control unit is configured to display, on the display apparatus, the second screen that displays the process data of the plurality of lots on a substrate-by-substrate basis and the recipe of the plurality of lots.

11. The information processing apparatus according to claim 8, wherein at least one of the first screen and the second screen displays the process data as a graph.

12. The information processing apparatus according to claim 8, wherein a display method by which the second screen is displayed on the display apparatus is changeable to highlight a process condition that has a difference among process conditions of the plurality of lots.

13. The information processing apparatus according to claim 8, further comprising a calculation unit configured to calculate lot-based process data based on a plurality of pieces of substrate-based process data acquired by the acquisition unit.

14. The information processing apparatus according to claim 13, wherein the calculation unit is configured to calculate the lot-based process data based on at least one statistical process from a maximum value, a minimum value, a mean value, a median value, and a standard deviation of the plurality of pieces of substrate-based process data.

15. An information processing method comprising:
acquiring process information about a substrate process, the process information including process data and a recipe; and
controlling a display on a display apparatus based on the acquired process information,
wherein, control is performed to selectively display, on the display apparatus, a first screen or a second screen,
wherein the first screen displays the process data of a plurality of lots, on a lot-by-lot basis,
wherein the second screen simultaneously displays a first process data of a first lot and a second process data of a second lot, on a substrate-by-substrate basis, the first lot being a lot designated from the plurality of lots displayed on the first screen,
the second lot being processed by the same recipe as a recipe by which the first lot is processed, and
wherein the second screen displays the first process data of each of a plurality of substrates included in the first lot and the second process data of each of a plurality of substrates included in the second lot.

16. An information processing method comprising:
acquiring process information about a substrate process, the process information including process data and a recipe; and
controlling a display on a display apparatus based on the acquired process information,
wherein controlling is configured to display, on the display apparatus, a first screen that displays the process data of a plurality of lots, on a lot-by-lot basis, together with a second screen that simultaneously displays a first process data of a first lot and a second process data of a second lot, on a substrate-by-substrate basis, the first lot being a lot designated from the plurality of lots displayed on the first screen,
the second lot being processed by the same recipe as a recipe by which the first lot is processed, and
wherein the second screen displays the first process data of each of a plurality of substrates included in the first lot and the second process data of each of a plurality of substrates included in the second lot.

17. A non-transitory computer-readable storage medium that stores a program for causing a computer to execute an information processing method including acquiring and controlling a display,
wherein process information about a substrate process, the process information including process data and a recipe are acquired, and
wherein control is performed to selectively display, on the display apparatus, a first screen or a second screen,
wherein the first screen displays the process data of a plurality of lots, on a lot-by-lot basis,
wherein the second screen simultaneously displays a first process data of a first lot and a second process data of a second lot, on a substrate-by-substrate basis, the first lot being a lot designated from the plurality of lots displayed on the first screen,
the second lot being processed by the same recipe as a recipe by which the first lot is processed, and
wherein the second screen displays the first process data of each of a plurality of substrates included in the first lot and the second process data of each of a plurality of substrates included in the second lot.

18. A system comprising:
an information processing apparatus; and
a pattern forming apparatus configured to form a pattern on a substrate,
wherein the information processing apparatus manages a plurality of apparatuses including the pattern forming apparatus,
the information processing apparatus including:
an acquisition unit configured to acquire process information about a substrate process, the process information including process data and a recipe; and
a display control unit configured to control a display on a display apparatus based on the process information acquired by the acquisition unit, wherein the display control unit selectively displays, on the display apparatus, a first screen that displays the process data of a plurality of lots, on a lot-by-lot basis, and a second screen that simultaneously displays a first process data of a first lot and a second process data of a second lot, on a substrate-by-substrate basis, the first lot being a lot designated from the plurality of lots displayed on the first screen, the second lot being processed by the same recipe as a recipe by which the first lot is processed, and wherein the second screen displays the first process data of each of a plurality of substrates included in the first lot and the second process data of each of a plurality of substrates included in the second lot.

19. An article manufacturing method comprising:

forming a pattern on a substrate by a pattern forming apparatus managed by an information processing apparatus; and performing at least one process from oxidation, film forming, vapor deposition, doping, flattening, etching, resist removing, dicing, bonding, and packaging on the substrate having the pattern formed thereon, wherein an article is manufactured from the processed substrate, the information processing apparatus including:

an acquisition unit configured to acquire process information about a substrate process, the process information including process data and a recipe; and a display control unit configured to control a display on a display apparatus based on the process information acquired by the acquisition unit, wherein the display control unit performs control to selectively display, on the display apparatus, a first screen that displays the process data of a plurality of lots, on a lot-by-lot basis, and a second screen that simultaneously displays a first process data of a first lot and a second process data of a second lot, on a substrate-by-substrate basis, the first lot being a lot designated from the plurality of lots displayed on the first screen, the second lot being processed by the same recipe as a recipe by which the first lot is processed, and wherein the second screen displays the first process data of each of a plurality of substrates included in the first lot and the second process data of each of a plurality of substrates included in the second lot.

* * * * *